US011022900B2

(12) United States Patent
Mathijssen et al.

(10) Patent No.: US 11,022,900 B2
(45) Date of Patent: Jun. 1, 2021

(54) INSPECTION APPARATUS AND METHODS, SUBSTRATES HAVING METROLOGY TARGETS, LITHOGRAPHIC SYSTEM AND DEVICE MANUFACTURING METHOD

(71) Applicant: ASML Netherlands B.V., Veldhoven (NL)

(72) Inventors: Simon Gijsbert Josephus Mathijssen, Veldhoven (NL); Stefan Hunsche, Santa Clara, CA (US); Markus Gerardus Martinus Maria Van Kraaij, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/931,002

(22) Filed: Jul. 16, 2020

(65) Prior Publication Data

US 2020/0348605 A1 Nov. 5, 2020

Related U.S. Application Data

(62) Division of application No. 15/961,377, filed on Apr. 24, 2018, now Pat. No. 10,761,432, which is a
(Continued)

(51) Int. Cl.
*G03F 7/20* (2006.01)
*G03F 7/213* (2006.01)
*G03F 7/22* (2006.01)

(52) U.S. Cl.
CPC .......... *G03F 7/70683* (2013.01); *G03F 7/213* (2013.01); *G03F 7/22* (2013.01);
(Continued)

(58) Field of Classification Search
CPC ............ G03F 7/70633; G03F 7/70625; G03F 7/70683
See application file for complete search history.

(56) References Cited

U.S. PATENT DOCUMENTS

| 7,068,833 B1 | 6/2006 | Ghinovker et al. |
| 7,298,481 B2 | 11/2007 | Mieher et al. |
(Continued)

FOREIGN PATENT DOCUMENTS

| CN | 101299132 A | 11/2008 |
| CN | 101903832 A | 12/2010 |
(Continued)

OTHER PUBLICATIONS

International Search Report and Written Opinion of the International Search Authority directed to related International Patent Application No. PCT/EP2014/071910, dated Apr. 15, 2015; 15 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

Disclosed is an inspection apparatus for use in lithography. It comprises a support for a substrate carrying a plurality of metrology targets; an optical system for illuminating the targets under predetermined illumination conditions and for detecting predetermined portions of radiation diffracted by the targets under the illumination conditions; a processor arranged to calculate from said detected portions of diffracted radiation a measurement of asymmetry for a specific target; and a controller for causing the optical system and processor to measure asymmetry in at least two of said targets which have different known components of positional offset between structures and smaller sub-structures within a layer on the substrate and calculate from the results
(Continued)

of said asymmetry measurements a measurement of a performance parameter of the lithographic process for structures of said smaller size. Also disclosed are substrates provided with a plurality of novel metrology targets formed by a lithographic process.

20 Claims, 10 Drawing Sheets

Related U.S. Application Data division of application No. 15/032,507, filed as application No. PCT/EP2014/071910 on Oct. 13, 2014, now Pat. No. 9,958,791.

(60) Provisional application No. 61/897,562, filed on Oct. 30, 2013.

(52) U.S. Cl.
CPC ...... *G03F 7/70466* (2013.01); *G03F 7/70616* (2013.01); *G03F 7/70633* (2013.01)

(56) References Cited

U.S. PATENT DOCUMENTS

| | | | |
|---|---|---|---|
| 8,455,162 | B2 | 1/2013 | Gabor et al. |
| 9,535,338 | B2 | 1/2017 | Jak et al. |
| 9,958,791 | B2 | 5/2018 | Mathijssen et al. |
| 10,761,432 | B2 | 9/2020 | Mathijssen et al. |
| 2005/0195398 | A1 | 9/2005 | Adel et al. |
| 2005/0244729 | A1 | 11/2005 | Liu et al. |
| 2006/0033921 | A1 | 2/2006 | Den Boef et al. |
| 2007/0279630 | A1* | 12/2007 | Kandel .............. G03F 7/70633 356/401 |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0134419 | A1* | 6/2011 | Fuchs ................. G01N 21/956 356/237.5 |
| 2012/0044470 | A1 | 2/2012 | Smilde et al. |
| 2012/0120396 | A1 | 5/2012 | Kandel et al. |
| 2012/0123581 | A1 | 5/2012 | Smilde et al. |
| 2012/0242970 | A1* | 9/2012 | Smilde ................ G03F 7/70483 355/77 |
| 2013/0001193 | A1* | 1/2013 | Gabor ...................... G03F 1/42 216/41 |
| 2013/0168877 | A1 | 7/2013 | Chui |
| 2013/0258310 | A1 | 10/2013 | Smilde et al. |
| 2013/0271740 | A1 | 10/2013 | Quintanilha |
| 2013/0278942 | A1 | 10/2013 | Jeong et al. |
| 2013/0342831 | A1 | 12/2013 | Levinski et al. |
| 2016/0274472 | A1 | 9/2016 | Mathijssen et al. |
| 2018/0239263 | A1 | 8/2018 | Mathijssen et al. |

FOREIGN PATENT DOCUMENTS

| | | |
|---|---|---|
| CN | 103201682 A | 7/2013 |
| WO | WO 2009/078708 A1 | 6/2009 |
| WO | WO 2009/106279 A1 | 9/2009 |
| WO | WO 2014/146906 A1 | 9/2014 |

OTHER PUBLICATIONS

International Preliminary Report on Patentability directed to related International Patent Application No. PCT/EP2014/071910, dated May 3, 2016; 10 pages.
Non-Final Rejection issued in related U.S. Appl. No. 15/032,507, dated Aug. 10, 2017; 10 pages.
Notice of Allowance issued in related U.S. Appl. No. 15/032,507, dated Dec. 27, 2017; 8 pages.
Non-Final Rejection issued in related U.S. Appl. No. 15/961,377, dated Feb. 7, 2019; 5 pages.
Final Rejection issued in related U.S. Appl. No. 15/961,377, dated Jul. 1, 2019; 7 pages.
Non-Final Rejection issued in related U.S. Appl. No. 15/961,377, dated Dec. 16, 2019; 7 pages.
Notice of Allowance issued in related U.S. Appl. No. 15/961,377, dated Apr. 27, 2020; 8 pages.

\* cited by examiner

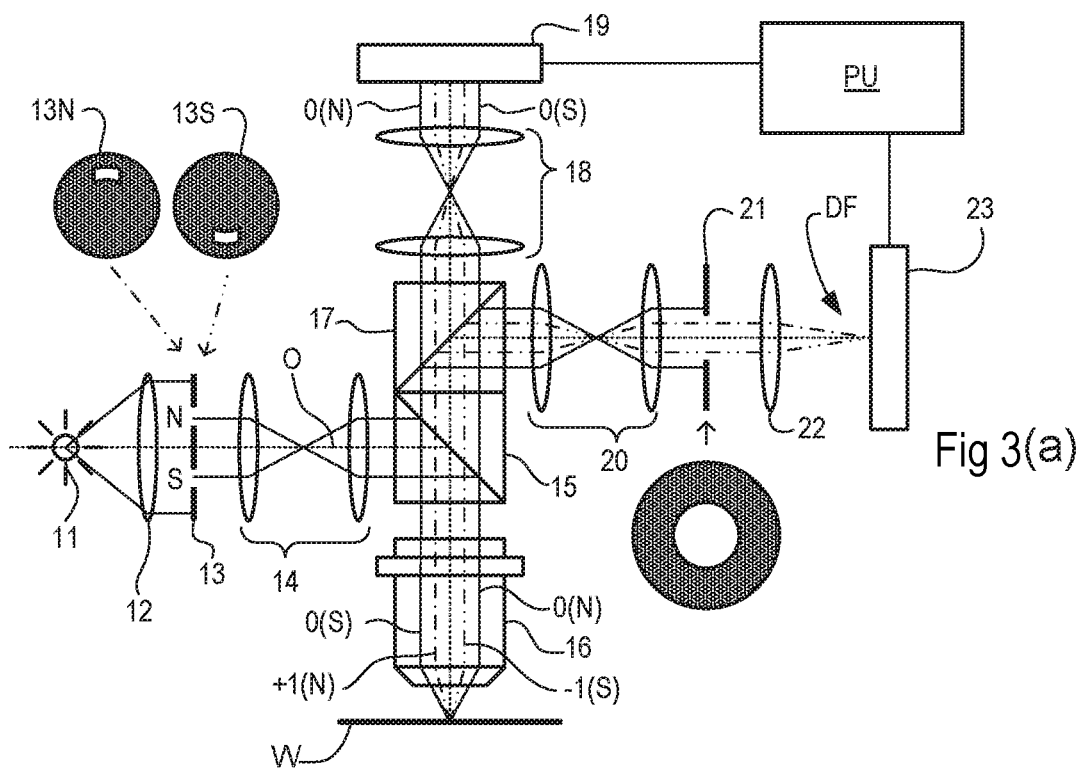
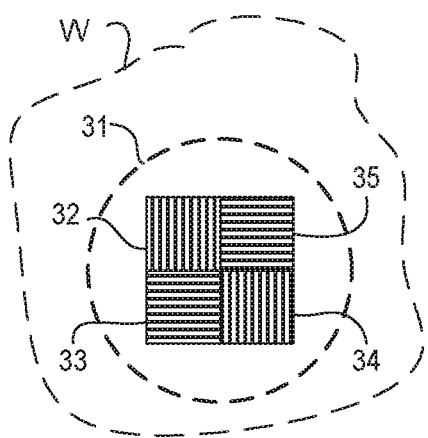
Fig. 4
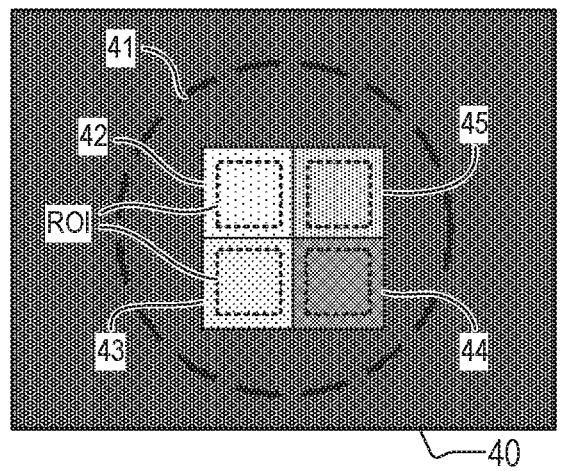
Fig. 5

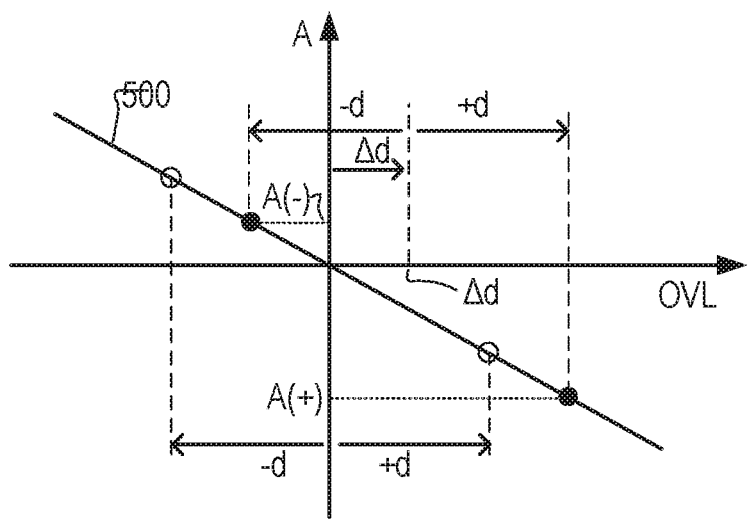
Fig. 7
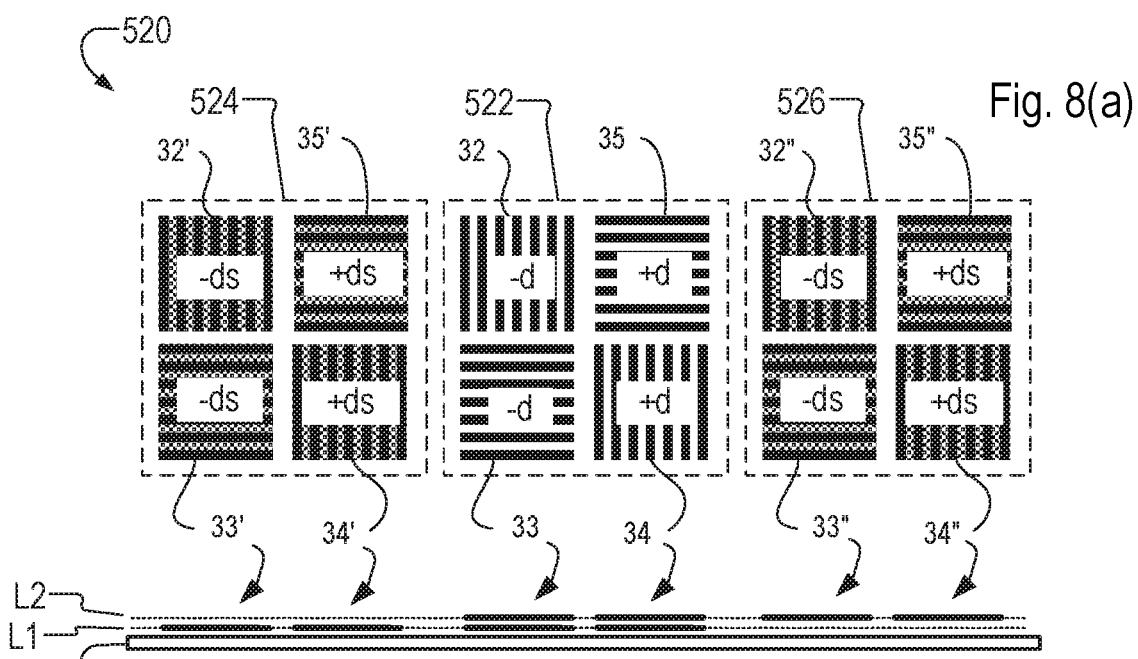
Fig. 8(a)
Fig. 8(b)

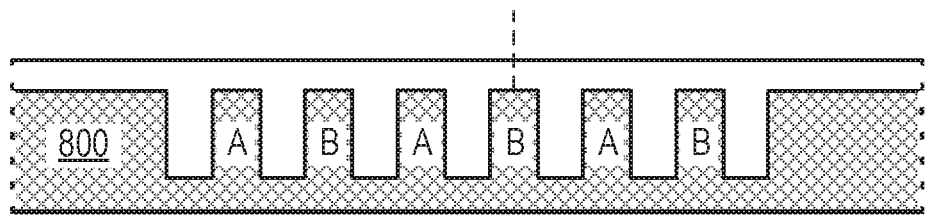
Fig. 14(a)
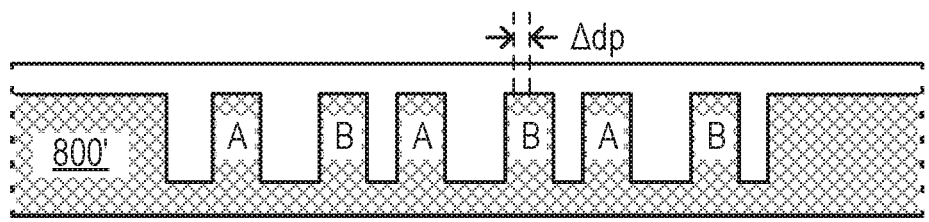
Fig. 14(b)
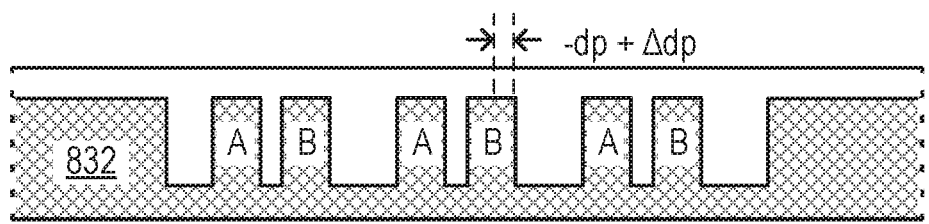
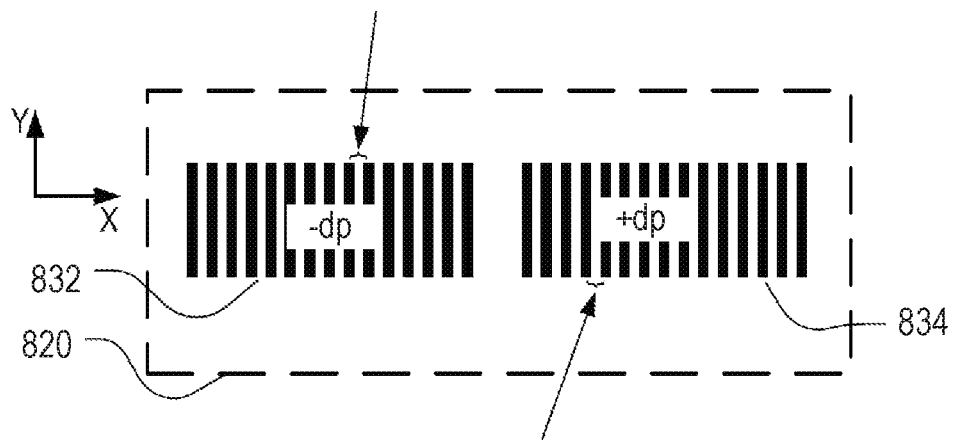
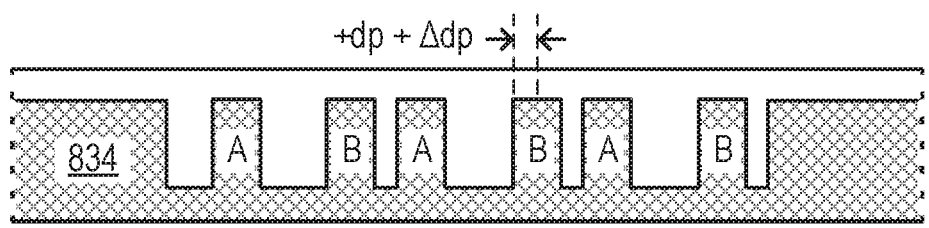
Fig. 15

INSPECTION APPARATUS AND METHODS, SUBSTRATES HAVING METROLOGY TARGETS, LITHOGRAPHIC SYSTEM AND DEVICE MANUFACTURING METHOD

CROSS-REFERENCE TO RELATED APPLICATIONS

This application is a divisional of U.S. application Ser. No. 15/961,377, filed on Apr. 24, 2018, which is a divisional of U.S. application Ser. No. 15/032,507, filed on Apr. 27, 2016 now U.S. Pat. No. 9,958,791, which is a National Stage Entry of PCT/EP2014/071910, filed on Oct. 13, 2014, which claims the benefit of U.S. Provisional Application No. 61/897,562, filed on Oct. 30, 2013, which are incorporated herein in their entireties by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

Currently the overlay is deduced from targets which have a significantly larger pitch than the product features under the assumption that both are equal. Sub-segmented targets are sensitive to for instance lens aberrations, which cause a shift between the at-resolution subsegmentation and the larger overlay target grating pitch. Therefore the effective accuracy of the overlay measurement is compromised.

A similar to overlay error between layers is mismatch between populations in a single layer, formed by different steps in a process. For example, the finest product features are nowadays formed by multiple-patterning processes. It would be useful if the capabilities of existing metrology hardware could be extended to measurement of mismatch in double- and multiple-patterning processes. Again, however, the size of the product features is many times smaller than the resolution of the metrology hardware.

SUMMARY

It is desirable to provide a technique for overlay metrology which is less susceptible to inaccuracies of the type just mentioned, while using if possible the existing metrology hardware.

It is desirable separately to provide a technique for mismatch metrology using the existing metrology hardware.

The invention in a first aspect provides an inspection apparatus for measuring a property of a lithographic process, the apparatus comprising: a support for a substrate carrying a plurality of metrology targets comprising structures formed by the lithographic process; an optical system for illuminating the plurality of targets under predetermined illumination conditions and for detecting predetermined portions of radiation diffracted by the targets under said illumination conditions; a processor arranged to calculate from said detected portions of diffracted radiation a measurement of asymmetry for a specific target; and a controller for causing said optical system and processor to measure asymmetry in at least two of said targets which have different known components of positional offset between structures and smaller sub-structures within a layer on the substrate and calculate from the results of said asymmetry measurements a measurement of a performance parameter of the lithographic process for structures of said smaller size.

In one embodiment, said performance parameter is an overlay parameter of the lithographic process for structures of said smaller size and is calculated by combining results of said asymmetry measurements with measurements of asymmetry in at least two overlay targets which have different known components of positional offset between first and second layers on the substrate. Asymmetry may be measured in auxiliary targets having different known components of positional offset in each of the first and second layers.

In another embodiment, that may be applied in multiple-patterning processes, the controller is arranged to cause said optical system and processor to measure asymmetry in at least two of said targets which have different known components of positional offset between interleaved populations of sub-structures within the target and to calculate from the results of said asymmetry measurements a measurement of an overlay parameter of the lithographic process used to form said sub-structures.

In a second aspect, an embodiment of the present invention provides a substrate provided with a plurality of metrology targets formed by a lithographic process, each target comprising structures arranged to repeat with a spatial period in at least a first direction, wherein said metrology targets include: a plurality of overlay targets, at least some of said structures in each overlay target being replicated in first and second layers on said substrate and superimposed on one another and wherein each overlay target is formed with a positional offset between the layers that is a combination of both known and unknown components, the known components being different for different targets; and a plurality of auxiliary targets, each auxiliary target comprising sub-structures of a size several times smaller than said spatial period, wherein each auxiliary target is formed in one of said layers and is formed with a positional offset between the sub-structures and structures that is a combination of both known and unknown components, the known components being different for different targets.

An embodiment of the present invention in the second aspect further provides a patterning device (or pair of patterning deices) for use in a lithographic process, the patterning device defining a pattern which when applied to a substrate will produce a substrate according to the second aspect of an embodiment of the present invention, as set forth above An embodiment of the present invention in a third aspect provides a substrate provided with a plurality of metrology targets formed by a lithographic process, each target comprising structures arranged to repeat with a spatial period in at least a first direction, wherein said metrology targets include a plurality of targets each of which comprises sub-structures of a size several times smaller than said spatial period, wherein each target is formed with a positional offset between two interleaved populations of sub-structures that is a combination of both known and unknown components, the known components being different for different targets.

An embodiment of the present invention in the third aspect yet further provides a pair of patterning devices for use in a lithographic process, the patterning devices defining patterns which when applied sequentially to a substrate will produce a substrate according to the third aspect of an embodiment of the present invention, as set forth above.

An embodiment of the present invention in a further aspect provides a method of measuring a performance parameter of a lithographic process, the method comprising the steps of: (a) performing said lithographic process to produce structures forming a plurality of metrology targets on a substrate, at least two of said targets having a positional offset between structures and smaller sub-structures that is a combination of both known and unknown components, the known components of positional offset being different for different targets; (b) using the inspection apparatus to measure asymmetry in at least two of said auxiliary targets having different known components of positional offset between structures and smaller sub-structures within a layer on the substrate; and (c) calculating using the results of the asymmetry measurements made in step (b) a measurement overlay performance parameter of the lithographic process for structures of said smaller size.

An embodiment of the present invention in some embodiments can be implemented using existing metrology apparatus such as a scatterometer An embodiment of the present invention can be implemented in an automated apparatus using modified software.

An embodiment of the present invention in the fourth aspect further provides a computer program product comprising machine-readable instructions for causing a processor to perform the step (c) of a method as set forth above. The processor may be further programmed to control an optical system and processor to perform the step (b) of the method.

An embodiment of the present invention yet further provides a lithographic system comprising: a lithographic apparatus arranged to transfer a sequence of patterns from patterning devices onto a substrate in an overlying manner; and an inspection apparatus according to any of the aspects of an embodiment of the present inventions as set forth above, wherein the lithographic apparatus is arranged to use the calculated performance parameter from the inspection apparatus in applying said sequence of patterns to further substrates.

An embodiment of the present invention yet further provides a method of manufacturing devices wherein a sequence of device patterns is applied to a series of substrates using a lithographic process, the method including inspecting a plurality of metrology targets as part of or beside said device patterns on at least one of said substrates using an inspection method as set forth above, and controlling the lithographic process for later substrates in accordance with the calculated performance parameter.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) illustrate (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIG. 7 illustrates principles of overlay measurement applied in embodiments of the present invention;

FIGS. 8a and 8b illustrate a novel composite target in (a) plan view and (b) schematic cross-section having bias schemes and auxiliary targets that can be used in embodiments of the present invention;

FIGS. 14(a) and 14(b) illustrate the phenomenon of mismatch in structures formed by multiple-patterning process;

FIG. 15 illustrates the form of component gratings in a novel composite target for measuring mismatch in structures formed by multiple-patterning process according to an embodiment of the invention.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
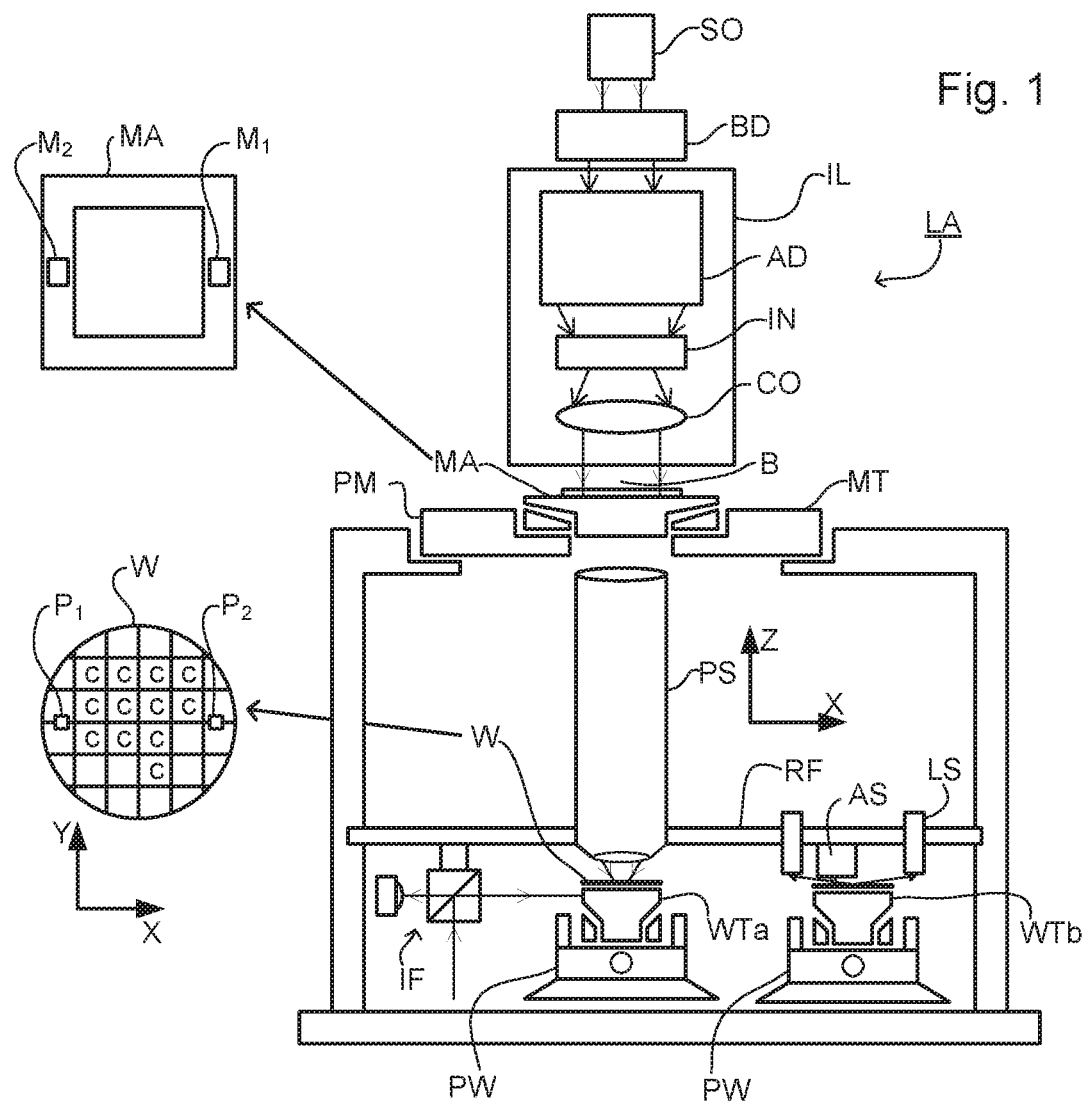
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Examples of known scatterometers include angle-resolved scatterometers of the type described in US2006033921A1 and US2010201963A1, which are incorporated by reference herein in their entireties. The targets used by such scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. In order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. Examples of dark field metrology can be found in international patent applications WO 2009/078708 and WO 2009/106279 which documents are hereby incorporated by reference in their entirety. Further developments of the technique have been described in published patent publications US20110027704A, US20110043791A, US20120044470A US20120123581A, US20130258310A and US20130271740A and in the U.S. patent applications 61/652,552 and 61/803,673, which documents are hereby incorporated by reference in their entirety. These targets can be smaller than the illumination spot and may be surrounded by product structures on a wafer. Multiple gratings can be measured in one image, using a composite grating target. The contents of all these applications are also incorporated herein by reference.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

Figure 2:
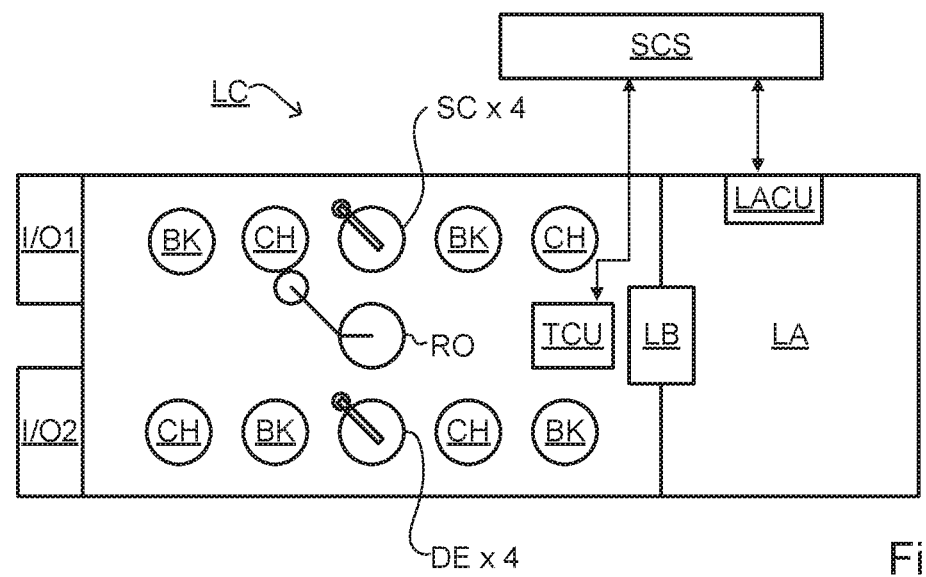
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus (scatterometer) suitable for use in embodiments of the invention is shown in FIG. 3(*a*). A grating target T and diffracted rays are illustrated in more detail in FIG. 3(*b*). More detail of the apparatus and variations in its forma and usage are provided in US 2011027704 and other patent applications, mentioned above. The entire contents of those applications are incorporated herein by reference. The scatterometer may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The aperture plates in the present examples form various off-axis illumination modes. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(*b*), grating target T is placed with substrate W normal to the optical axis O of objective lens 16. A ray of illumination I impinging on target T from an angle off the axis O gives rise to a zeroth order ray (solid line O) and two first order rays (dot-chain line +1 and double dot-chain line −1). It should be remembered that with an overfilled small target grating, these rays are just one of many parallel rays covering the area of the substrate including metrology target T and other features. Where a composite grating target is provided, each individual grating within the target will give rise to its own diffraction spectrum. Since the aperture in plate 13 has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for asymmetry measurement as well as for many measurement purposes such as reconstruction, which are not the subject of the present disclosure. The first examples to be described will use the second measurement branch to measure asymmetry.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed on sensor 23, if only one of the −1 and +1 orders is present.

The particular forms of aperture plate 13 and field stop 21 shown in FIG. 3 are purely examples. In another embodiment of the invention, on-axis illumination of the targets is used, and an aperture stop with an off-axis aperture is used to pass substantially only one first order of diffracted light to the sensor. (The apertures shown at 13 and 21 are effectively swapped in that case.) In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In practice, there are many possible types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode. A further variety of aperture plate 13Q will be illustrated in the example of FIGS. 12 and 13.

Overlay Measurement Using Small Targets—Introduction

FIG. 4 depicts a composite grating target formed on a substrate W according to known practice. The composite target comprises four individual gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semiconductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations one of the components would be offset relative to the other by a distance d. Grating 34 has its components arranged so that, if perfectly printed, there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The cross-hatched rectangle 40 represents the field of the image on the sensor, within which the illuminated spot 31 on the substrate is imaged into a corresponding circular area 41. Ideally the field is dark. Within this dark field image, rectangular areas 42-45 represent the images of the individual gratings 32 to 35. If the gratings are located in product areas, product features may also be visible in the periphery of this image field. While only a single composite grating target is shown in the dark field image of FIG. 5, in practice a semiconductor device or other product made by lithography may have many layers, and overlay measurements are desired to be made between different pairs of layers. For each overlay measurement between pair of layers, one or more composite grating targets are required, and therefore other composite grating targets may be present, within the image field. Image processor and controller PU processes these images using pattern recognition to identify the separate images 42 to 45 of gratings 32 to 35.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter, and comparing the intensities reveals asymmetries that can be used as a measure of overlay. In another technique for measuring asymmetry and hence overlay, the pupil plane image sensor 19 is used. An example using this sensor will be described later with reference to FIGS. 12 and 13.

Measurement of At-Resolution Overlay

In modern lithographic processes, functional product features printed by the lithographic apparatus may have very small dimensions, smaller than can be resolved by the conventional metrology apparatus. Consequently, features in the gratings 32-35 of the metrology target are formed on a larger scale. As an example, the pitch of the metrology target may be in the range 500 nm or 600 nm to 1000 nm or even 2000 nm. In other words, individual features (grating lines) would be 250 nm to 1000 nm in width. Product features formed at the resolution of the lithography tool may have dimensions less than 100 nm, for example less than 50 nm or even less than 20 nm. These finer features are referred to commonly as "at-resolution" features, by reference to the resolving power of the patterning system in the lithographic apparatus. It is known to form coarse grating features of metrology gratings using at-resolution features, in order that effects of processing steps in the metrology grating are not very different from effects in the product features. However, the metrology apparatus does not "see" these at-resolution features. (With respect to the metrology apparatus, they are "sub-resolution" features.)

While the metrology apparatus can measure the overlay error between coarse gratings to an accuracy of a few nanometers, such a coarse grating is not representative of the actual product features. The metrology targets are applied to the substrate by the same lithographic apparatus and process steps that form the functional product features, but the at-resolution features become subject to slightly different errors in their positioning than the coarser overlay grating features, for example due to aberrations in an optical projection system used to apply the pattern. The effect of this in current metrology apparatus is that the measured overlay, while accurately representing overlay error in the position of the coarse grating, does not accurately represent overlay in the finer, at-resolution features elsewhere on the same substrate. Since it is the at-resolution features that define the performance of the functional end product, the result is that the accuracy of the overlay measurement is not as relevant as one would like.

The inventors have recognized that, by forming and measuring novel metrology targets both with and without at-resolution features, the metrology apparatus can be used to obtain "at-resolution overlay" measurements, meaning overlay measurements that are more representative of overlay between at-resolution product features elsewhere on the substrate. Before describing the novel targets and methods in detail, we will present an overview of one example of the novel overlay measurement process.

Figure 6:
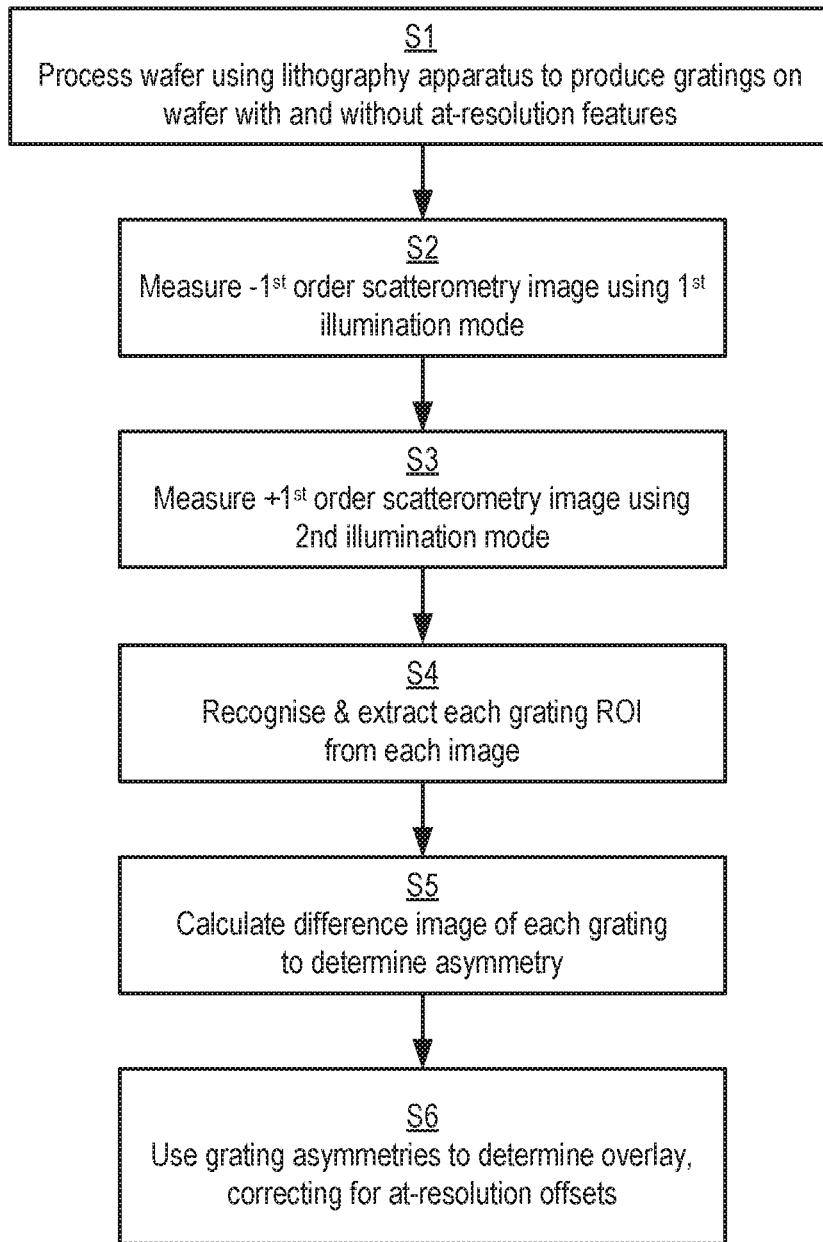
FIG. 6 is a flowchart showing the steps of an overlay measurement method using the scatterometer of FIG. 3 and novel metrology targets, in accordance with a first embodiment of the present invention.

FIG. 6 illustrates a method of measuring at-resolution overlay using novel targets. The method in this example is based on the method described in application US 2011027704 using the apparatus of FIGS. 3 and 4. In principle, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including not only the overlay gratings 32-35 but also auxiliary targets. The auxiliary targets comprise gratings having coarse structures but also smaller-scale (at-resolution) sub-structures with programmed (known) offsets between the at-resolution substructures and the coarse structures. Examples of these auxiliary gratings will be described in detail later. The overlay gratings 32-35 may comprise only coarse structures within the resolving power of the scatterometer, or may comprise at resolution features, but without different programmed offsets.

At S2, using the metrology apparatus of FIG. 3, an image of the gratings 32 to 35 and the auxiliary gratings is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image. It is a matter of design choice whether all the gratings 32-35 and the auxiliary gratings can be captured in each image, or whether the scatterometer and substrate need to be moved so as to capture the auxiliary gratings in one or more separate images. In either case, it is assumed that first and second images of all the component gratings are captured via image sensor 23.

Note that, by including only half of the first order diffracted radiation in each image, the 'images' referred to here are not conventional dark field microscopy images. Each grating will be represented simply by an area of a certain intensity level. The individual grating lines will not be resolved, because only one of the +1 and −1 order diffracted radiation is present. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. As described in the applications, this is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

FIG. 7 illustrates the principle of calculating an overlay measurement from asymmetries in the intensity of different diffraction orders, using the method of FIG. 6. The horizontal axis represents overlay OVL, while the vertical axis represents an asymmetry signal A, obtained as a difference in intensity between the different diffraction orders of a given target grating. The line 500 illustrates the (approximately) linear relationship between the asymmetry signal and the displacement of one set of features (grating lines) in the overlay grating with respect to another. The scales of the axes are arbitrary and the slope of the line 500 need not be known in absolute terms. What is known is that the asymmetry signal goes to zero where the overlay is zero. Using biased gratings, and knowledge of the biases, the unknown displacement can be calculated.

In the example, biased gratings with (programmed) offsets −d and +d are used. The fact that the offsets are equal and opposite is for simplicity only. (In general, arbitrary offsets d1 and d2 can be envisaged.) In an ideal case, where the target is printed perfectly, there is no other source of displacement and the asymmetry in the gratings will be equal and opposite, as shown by open circles. In a real target, however, an unknown displacement Δd will also be present, which shifts the signals to the positions shown by the solid circles. The asymmetry signals obtained from the biased gratings are labeled A(−) and A(+). Knowing the offsets −d and +d and knowing that the asymmetry should be zero when overlay is zero, the unknown displacement Δd can be calculated from the asymmetry signals to obtain a measurement of overlay error.

In the applications, mentioned above, various techniques are disclosed for improving the quality of overlay measurements using the basic method mentioned above. These techniques are explained in the applications, and will not be explained here in further detail. They may be used in combination with the techniques newly disclosed in the present application, which will now be described.

Returning to FIG. 6, in the present novel method, asymmetry is also measured in the auxiliary gratings, so as to measure differences in position between the coarse grating features and the at-resolution features on the substrate. In this way, the overlay measurement obtained in step S6 is corrected to be more representative of the at-resolution overlay in the product features on the substrate. The principles and implementation of this correction will now be described.

FIG. 8 shows a novel composite metrology target 520 for use in the method of FIG. 6. The upper part (a) of the figure shows the target in plan view, while the lower part (b) shows it in cross-section. The cross-section shows schematically substrate W and product layers L1 and L2. A real product will have many layers in practice. The composite target in this example comprises at its center a composite target 522 that is identical to the set of component overlay gratings 32-35 used in the known method. As seen in the cross-section, these targets have grating features in both layers L1 and L2 (and which may include at-resolution features). Either side of the target 522 are two auxiliary targets 524 and 526. These auxiliary targets comprise gratings with coarse features and at-resolution features, but formed only in one layer. Thus target 524 comprises four auxiliary component gratings 32' to 35' formed in layer L1, while target 526 comprises four auxiliary component gratings 32" to 35" formed in layer L2.

Figure 9A:
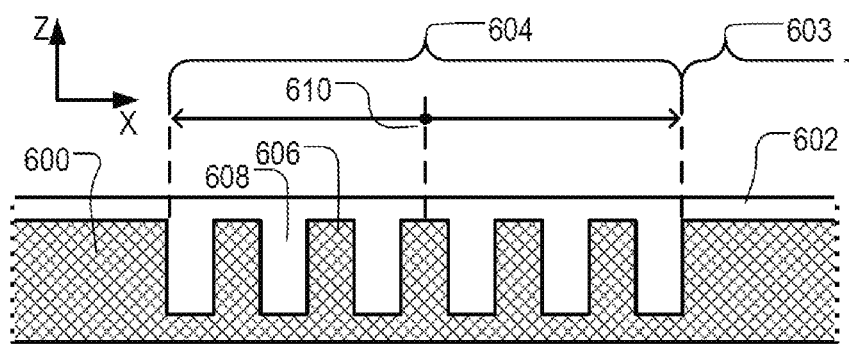
FIGS. 9(a) and 9(b) illustrate part of a grating structure having at-resolution features (a) in an ideal form and (b) with a displacement caused by aberration in a lithographic step.
Figure 9B:
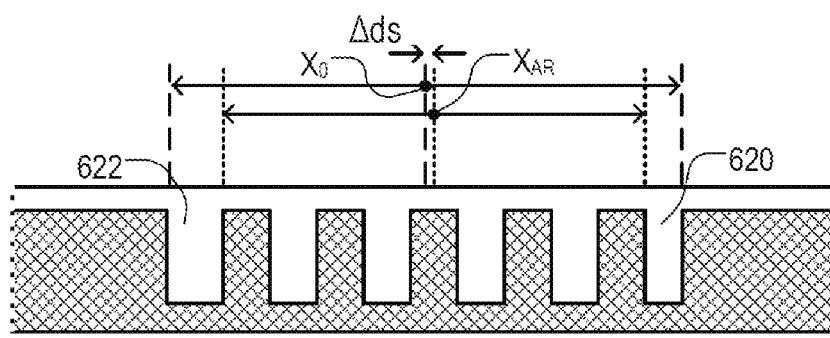

Referring now to FIG. 9, we see part of a grating having "at-resolution" features that are similar in dimension to the functional product features on the substrate, but are too small to be resolved individually by the scatterometer. FIG. 9 (a) shows in cross-section a small portion of a diffraction grating an overlay target such as the X-direction grating 32' in FIG. 9 (a). Specifically we see roughly one repeating unit comprising a line-space pattern that is repeated with a known periodicity, to form the whole grating. The grating is formed in materials 600, 602 having different refractive indices, arranged in a periodic pattern whose repeating unit comprises "line" regions 603 and "space" regions 604. The line-space pattern may in particular be formed by etching a pattern that is applied to a substrate using the lithographic apparatus of FIG. 1 or a similar apparatus. The designations "line" and "space" in such a pattern are quite arbitrary. In fact, it will be noted that each "space" region 604 of the line is formed such that the material 600 is not uniformly absent, but is rather present in a fine-pitch grating pattern comprising smaller lines 606 and spaces 608. Optionally, each "mark" region 603 may be formed such that the material 600 is not uniformly present, but is present in a similar fine pitch grating pattern. This fine pitch pattern may have a periodicity in the Y direction, that is into the page, and is therefore not visible in the cross-sections shown in FIG. 9. These finer lines and spaces are what is referred to herein as the "at-resolution" features, being at or close to the limit of resolution of the projection system in the lithographic apparatus that will use them. They may also be referred to as "sub-resolution" features as far as the metrology apparatus (scatterometer) shown in FIG. 3 is concerned.

Ideally, the fine grating formed by lines 606 will be centered on the same point 610 as the coarse grating. This point 610, averaged over all the lines in the grating, may define a central reference position of the whole target. Sub-segmented targets are sensitive to lens aberrations, however, in the process by which the target is formed. These aberrations cause a shift between the at-resolution features and the coarse grating pitch.

FIG. 9 (b) shows the form of such a sub-segmented grating, similar to the ideal form (a) but exhibiting a shift or mismatch between the coarse grating pitch and the at-resolution features. This grating has become asymmetric due to a shift between the larger grating pitch and the at-resolution structures. A space 620 at one end of region 604 the sub-segmented space portion has become slightly narrower than space 622 at the other end. The at-resolution grating therefore has a central point at a position XAR which is not exactly coincident with the central point X0 of the coarse overlay grating. A mismatch or shift Δds represents the difference between X0 and XAR, and may be measured for example in nanometers Returning to FIG. 8, it can be seen that, while the overlay gratings 32-35 have overlay offsets −d and +d programmed into them, auxiliary gratings 32'-35' and 32"-35" have programmed offsets in the positioning of at-resolution features with respect to the coarse grating structure. These offsets are labeled −ds and +ds in the X and Y direction gratings. The inventors have recognized that offsets between the at-resolution features and the coarse grating can be measured through asymmetry signals in the same way as the main overlay can be measured. By combining the overlay measurement with auxiliary measurements made in each layer, the corrected overlay measurement can be calculated in step S6 of the method of FIG. 6.

Figure 10:
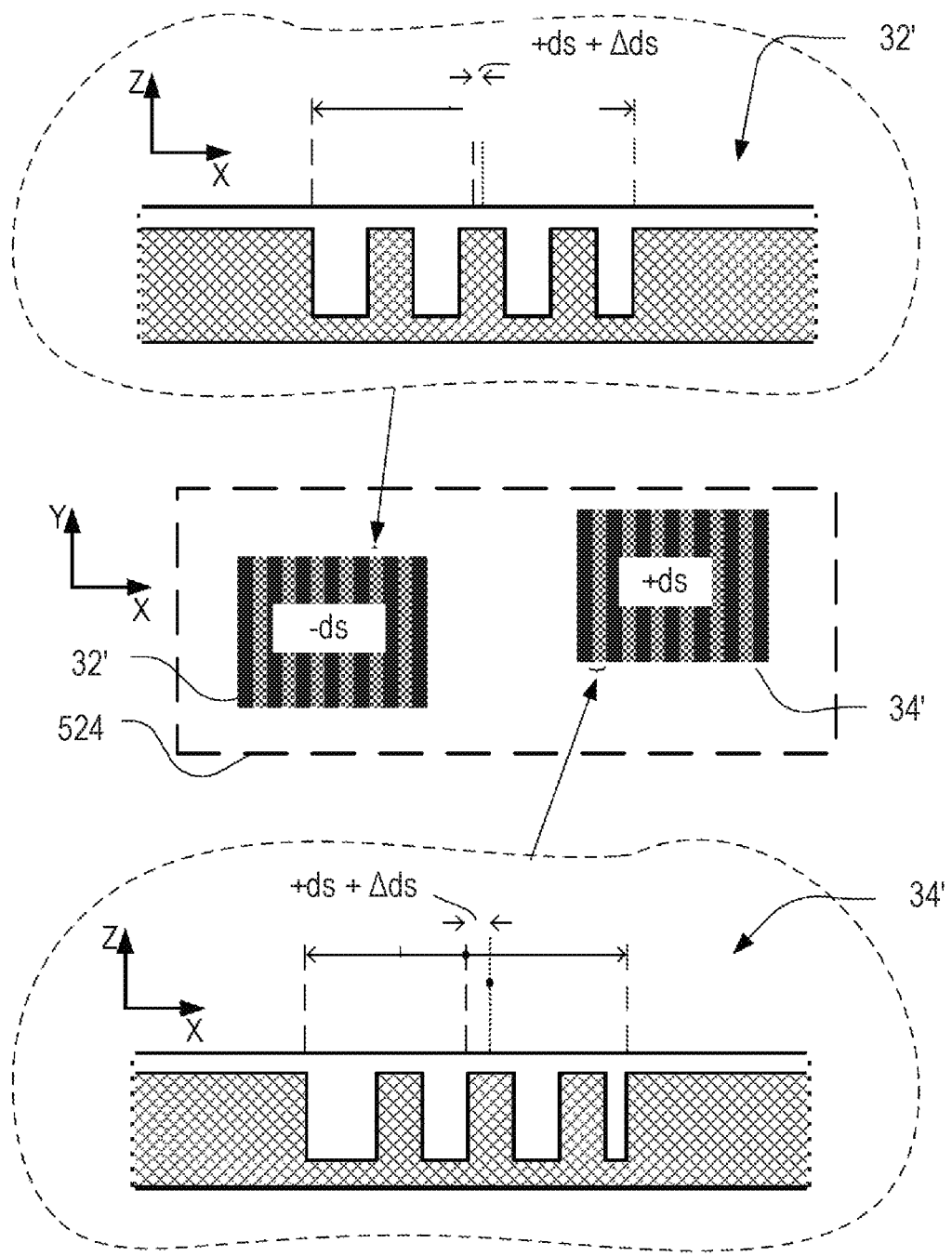
FIG. 10 shows in more detail an auxiliary component gratings in the novel composite target for overlay metrology according to an embodiment of the invention.

FIG. 10 illustrates in detail the application of programmed offsets in two auxiliary component gratings within one of the auxiliary targets, for example target 524. A schematic cross-section of a first component grating 32' is shown at the top of the drawing, while a cross-section of second component grating 34' is shown at the bottom. In the cross-sections, as in FIG. 9, only one of the repeating units of the overall pattern is shown, centered on a space region. Only three at-resolution lines are shown, and shifts are exaggerated for clarity. A real grating would have in the region of five to twenty at-resolution lines and spaces in each space region of the larger pattern. In each segment there is both an unknown mismatch Δds caused by aberration or the like during formation of the target, and a programmed (known) offset −ds or +ds. The unknown mismatch is equal (or assumed equal) for the two gratings. Again, the values of these offsets are chosen for simplicity to be equal and opposite, but the number and value of the programmed offsets is a matter of choice. In practice, one would choose the offsets to be positive and negative values of equal magnitudes. However, the method to be described works with unequal magnitudes and with offsets that are both in the same direction. Similarly, the offset does not need to be either larger or smaller than the unknown mismatch. The example illustrated in FIG. 10 has offsets in opposite directions, but with magnitudes less than the (unknown) mismatch Δd. Therefore the total offset is in the same direction both segments.

While the at-resolution features in this example comprise dense lines, the at-resolution features can take other forms, particularly in a case where the product features elsewhere, that are the real interest of the user, have other forms. Thus the at-resolution features could be single lines rather than gratings. They could be arrays of blocks instead of lines, or single blocks.

Figure 11:
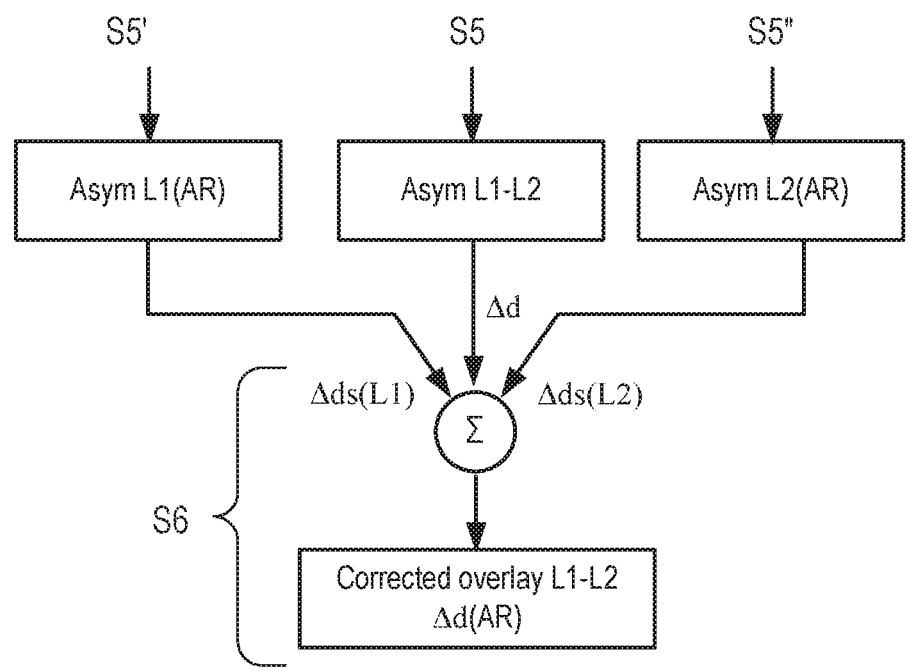
FIG. 11 is an expanded portion of the flowchart of FIG. 6, showing how measurements of auxiliary component gratings in the target of FIG. 8 are used to produce corrected overlay measurement.

FIG. 11 shows more detail of the steps S5 and S6 that yield an overlay measurement corrected for the mismatch between coarse features and at-resolution features in the vicinity of the composite target 520. Referring also to FIG. 7 the programmed offsets −ds/+ds and unknown mismatch Δds will yield certain asymmetry signals A when measured with the scatterometer of FIG. 3. In exactly the same way as the layer-to-layer overlay Δd can be calculated from the measured asymmetry signals and the known offsets, so the mismatch Δds in each layer L1, L2 between the coarse grating and the at-resolution features can be calculated from measurement of the auxiliary targets 524, 526. Thus, step S5 includes auxiliary measurements S5' on auxiliary target 524 and S5" on auxiliary target 526. These are combined in step S6 with the overlay measurement on target 522 to obtain a corrected overlay measurement Δd(AR) that is more representative. Various algorithms can be used to calculate the corrected measurement. For example, one can calculate explicitly the Δd and Δds values for each component target before combining them. Alternatively, one could to firstly combine the asymmetry signals and then calculate a corrected overlay. One can apply a more complicated analysis if desired, for example to bring in knowledge of the process and/or calibration data measured using different techniques.

The same measurements are repeated for the Y-direction overlay, and are also performed for as many targets as desired, across the substrate. The arrangement of the auxiliary gratings and overlay gratings in the composite target can be varied, for example mixing the overlay gratings and auxiliary gratings rather than grouping them in separate composite targets 522-526. Of course the number of component gratings in each composite target can be varied also, and there need not be the same number of component gratings in the auxiliary targets as in the overlay grating. In principle, an auxiliary grating may be provided in only one of the layers, if correction of displacements in the other layer is not required.

Figure 12:
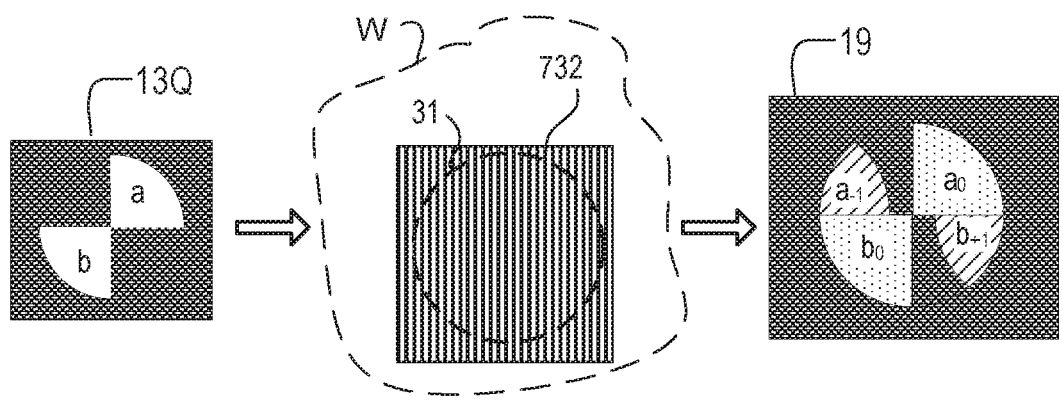
FIGS. 12 and 13 illustrated an alternative embodiment of the invention using large targets and using a pupil image sensor in the scatterometer of FIG. 3.
Figure 13:
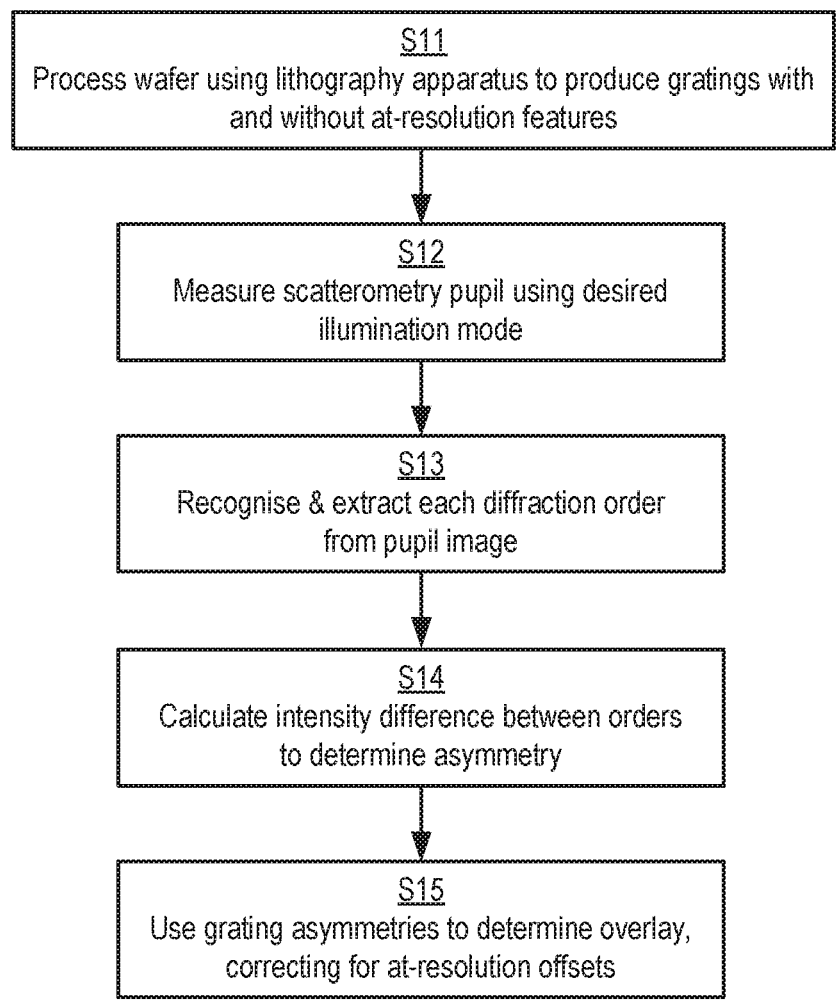

Referring to FIGS. 12 and 13, the novel method can be applied not only to small targets with dark field scatterometry, but also with large targets and angle-resolved scatterometry using the pupil plane image sensor 19. For this example, a symmetric, segmented illumination profile illustrated at 13Q is used. Two diametrically opposite quadrants, labeled a and b, are bright in this aperture pattern (transparent), while the other two quadrants are dark (opaque). This type of aperture is known in scatterometry apparatus, from the published patent application US 20100201963. As seen at the center of FIG. 12, a target grating 732 is used that is underfilled by the illumination spot 31. Not shown in the drawing, this grating 732 is part of a larger set of gratings forming component gratings of a composite target. By analogy with the example of FIG. 8, there may be component overlay gratings 732 to 735 and auxiliary component gratings 732' to 735' and 732" to 735".

Whereas, in the example of FIGS. 4 to 6, detector 23 is used in an image plane corresponding to the plane of substrate W, the method of FIGS. 12 and 13 uses the detector 19 that is positioned in a plane conjugate with a pupil plane of objective 16. Detector 19 may be an image sensor, for example a CCD camera sensor. Alternatively, individual point detectors may be deployed instead of image sensors. While the illumination pattern provided by aperture plate 13Q has bright quadrants labeled a and b at the left hand side in FIG. 12, the diffraction pattern seen by sensor 19 is represented at the right hand side. In this pattern, in addition to zero order reflections labeled a0 and b0 there are first order diffraction signals visible, labeled a−1, a+1, b−1 and b+1. Because other quadrants of the illumination aperture are dark, and more generally because the illumination pattern has 180° rotational symmetry, the diffraction orders a−1 and b+1 are "free" meaning that they do not overlap with the zero order or higher order signals from other parts of the illumination aperture. This property of the segmented illumination pattern can be exploited to obtain clear first order signals from a diffraction grating (overlay target) having a pitch which is half the minimum pitch that could be imaged if a conventional, circularly-symmetric illumination aperture were used. This diffraction pattern and the manner in which it can be exploited for scatterometry, are described in the known application US 20100201963.

FIG. 13 is a flowchart of the method of using the diffraction spectra of FIG. 12 from the targets 732 etc. to obtain overlay measurements corrected for at-resolution mismatch. The steps S11 to S15 correspond closely to the steps S1 to S6 of the FIG. 6 method, and will not be described in detail. The main difference is as follows. Recall that the FIG. 6 method obtains an asymmetry signal for grating 32 (for example) by comparing intensities of grating image 42 as seen in first and second images captured with the sensor 23. By contrast, the FIG. 13 method obtains an asymmetry signal for grating 732 (for example) by comparing intensities of the +1 and −1 diffraction orders extracted from within the same diffraction spectrum on pupil image sensor 19.

Measurement of Overlay in Multiple-Patterned Targets

The techniques described above can be applied to use the known scatterometer to measure mismatch between at-resolution features in other situations as well as in layer-to-layer overlay. A particular application is in so called double-patterning processes (generally multiple-patterning), where successive lithographic patterning steps are used to produce a pattern of very small structures within a single product layer, smaller than even the resolution of the patterning device. Techniques in this category include pitch-doubling, for example by litho-etch-litho-etch (LELE) and self-aligned dual-damascene in back end-of the line (BEOL) layers. It would be very useful to have a metrology technique to allow after-etch inspection and detection of actual overlay shifts between the two respective process steps at actual device pattern resolution.

FIG. 14 (a) shows schematically a grating structure 800 formed by double patterning. Similarly to the grating of FIG. 9 (a), this grating comprises a coarse line-space pattern, in which space regions are filled with sub-structures at a finer pitch. In the multiple-patterning process example, the sub-structures are formed in one layer of the product, but not in one patterning operation but in two or more steps. Thus, in this example, a first population of structures labeled A are interleaved with a second population of structures B, and the populations A and B are formed in different steps. While the placement of the populations A and B in FIG. 14 (a) is perfectly symmetrical, the structure 800' shown in FIG. 14 (b) exhibits a certain positional offset or "mismatch". Specifically, the population B structures are shifted relative to their ideal position by a mismatch amount labeled Δdp. The inventors have recognized that mismatch between the at-resolution features and the coarse grating can be measured through asymmetry signals in the same way as overlay can be measured, if targets with programmed offsets are formed and measured.

FIG. 15 shows schematically a sub-segmented metrology target 820, where two interleaved groups of sub-segmentation structures A and B formed in a pitch-doubling or other double patterning process. Two component gratings 832 and 834 are formed, each having the general form of the grating 800. Only six at-resolution lines are shown (three A and three B), and shifts are exaggerated for clarity. A real grating would have in the region of five to twenty or more at-resolution lines and spaces in each space region of the larger pattern. In each grating 832, 834 there is both an unknown positional offset (mismatch) Δdp caused by aberration or processing effects the like during formation of the structure, and a programmed (known) positional offset –dp (in grating 832) or +dp (in grating 834). The unknown mismatch is equal (or assumed equal) for the two gratings.

Again, the values of these offsets are chosen for simplicity to be equal and opposite, but the number and value of the programmed offsets is a matter of choice. In practice, one would choose the offsets to be positive and negative values of equal magnitudes. However, the method to be described works with unequal magnitudes and with offsets that are both in the same direction. Similarly, the offset does not need to be either larger or smaller than the unknown mismatch.

Figure 16:
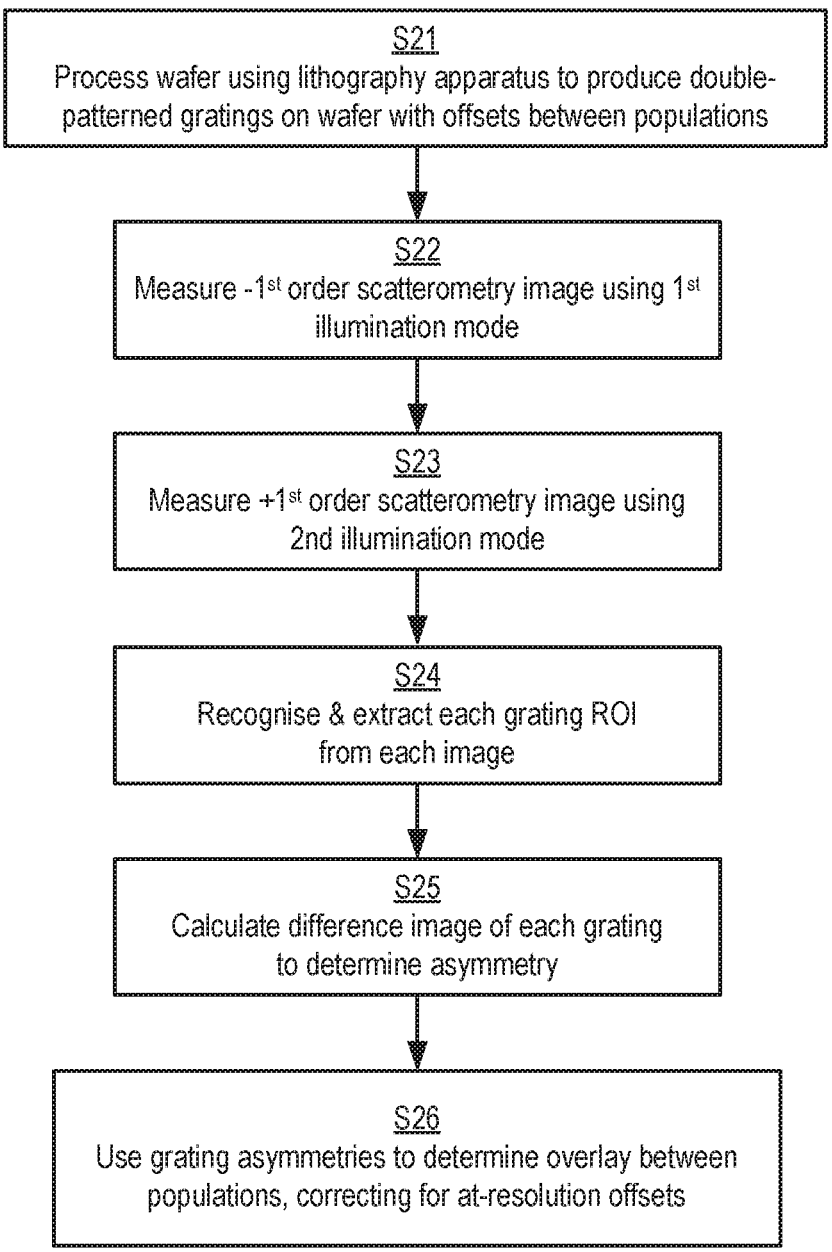
FIG. 16 is a flowchart of a method of measuring mismatch in structures formed by multiple-patterning process using the target of FIG. 15.

FIG. 16 is a flowchart of the method of using the novel target of FIG. 15 to measure mismatch in a multiple-patterning process. The steps S21 to S26 correspond closely with the steps S1 to S6 in the method of FIG. 6. Similar considerations apply except that there is no layer-to-layer overlay to be measured, only measurement of asymmetry of the component gratings 832 and 834. The method can be adapted to use the pupil image sensor 19 or another scatterometer, if desired. The principle of calculating the unknown mismatch using measured asymmetry signals and known mismatch values (offsets) is the same as illustrated and described above with reference to FIG. 7.

Simulation indicates that even small overlay shift between the two populations can be detected using the known scatterometer hardware with suitable targets. In the case of the modified overlay target, the number of component gratings and the programmed mismatches can be varied. Overlay between layers can of course be measured in addition to measuring mismatch between populations within a layer. Mismatch can be measure in X and Y direction, if appropriate.

The techniques disclosed herein enable the design and use of small or large metrology targets to achieve great accuracy and repeatability of overlay measurements, and or measurements of mismatch in multiple patterning processes. A particular benefit is that the existing high-throughput metrology hardware can be used to measure parameters of at-resolution features, having sizes far below the resolution of the metrology apparatus optical system. The need for more time-consuming or expensive metrology techniques (for example SEM) is reduced. Quality control in high-volume manufacture is enabled.

Numerous variations and modifications are possible, in addition to the ones mentioned already above. In the examples of FIG. 8, the X and Y gratings with each bias value are side-by-side, though that is not essential. The X- and Y-direction gratings are interspersed with one another in an alternating pattern, so that different X gratings are diagonally spaced, not side-by-side with one another, and Y gratings are diagonally spaced, not side-by-side with one another. This arrangement may help to reduce cross-talk between diffraction signals of the different biased gratings. The whole arrangement thus allows a compact target design, with good performance. In the examples described above, all the gratings are square, and arranged in a square grid. In another embodiment these gratings may be placed slightly off the square grid, or may be rectangular in shape in order to break the symmetry of the target. This may improve the accuracy & robustness of the pattern recognition algorithm that is used to find the targets in the images even further. Composite grating structures with elongate gratings are described for example in published patent application US20120044470, mentioned above.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed. The terms "structure" and "sub-structure" are used to denote coarse (large-scale) and fine (smaller-scale) structural features, without intending that these features are entirely distinct from one another. Indeed, as is clearly explained in the examples, coarse structural features, such as the lines and spaces of a grating, can be formed by collections of finer sub-structures.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified steps S4-S6 and so calculate overlay error corrected. The program may optionally be arranged to control the optical system, substrate support and the like to perform automatically the steps S2-S5, S12-S15, S22-S25 etc. for measurement of asymmetry on a suitable plurality of target structures.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   measuring, using a scatterometry apparatus, a $-1^{st}$ order scatterometry image of gratings on a substrate with offsets between grating populations using a first illumination mode;
   measuring, using the scatterometry apparatus, a $+1^{st}$ order scatterometry image of the gratings using a second illumination mode;
   determining a region of interest in each of the gratings from the $-1^{st}$ order and $+1^{st}$ order scatterometry images;
   calculating a difference image of each of the gratings from the $-1^{st}$ order and $+1^{st}$ order scatterometry images to determine a difference in intensity;
   determining a parameter of a lithographic process between the grating populations based on the difference in intensity; and
   correcting for at-resolution offsets based on the difference in intensity,
   wherein the grating populations comprise an overlay grating and at least one auxiliary target,
   wherein the at least one auxiliary target comprises gratings having coarse structures and fine at-resolution sub-structures with programmed offsets between the at-resolution sub-structures and the coarse structures, and
   wherein the at-resolution sub-structures are not resolved by the scatterometry apparatus.

2. The method of claim 1, wherein the gratings comprise double patterned gratings.

3. The method of claim 1, wherein the parameter of the lithographic process comprises overlay.

4. The method of claim 1, wherein the determining the parameter of the lithographic process is further based on a measurement of asymmetry.

5. The method of claim 1, wherein the correcting for the at-resolution offsets is further based on a measurement of asymmetry.

6. The method of claim 1, wherein the grating populations comprise first and second populations of structures in the gratings that are formed in different steps of the lithographic process.

7. The method of claim 1, wherein the offsets between the grating populations comprise positional offsets between interleaved populations of structures in the gratings.

8. A metrology apparatus comprising:
   a support configured to support a substrate, the substrate comprising gratings formed by a lithographic process;
   an optical system configured to:
   measure, using a scatterometry apparatus, a $-1^{st}$ order scatterometry image of the gratings with offsets between grating populations using a first illumination mode; and
   measure, using the scatterometry apparatus, a $+1^{st}$ order scatterometry image of the gratings using a second illumination mode; and a processor configured to:
determine a region of interest in each of the gratings from the $-1^{st}$ order and $+1^{st}$ order scatterometry images;
calculate a difference image of each of the gratings from the $-1^{st}$ order and $+1^{st}$ order scatterometry images to determine a difference in intensity;
determine a parameter of the lithographic process between the grating populations based on the difference in intensity; and
correct the parameter for at-resolution offsets based on the difference in intensity,
wherein the grating populations comprise an overlay grating and at least one auxiliary target,
wherein the at least one auxiliary target comprises gratings having coarse structures and fine at-resolution sub-structures with programmed offsets between the at-resolution sub-structures and the coarse structures, and
wherein the at-resolution sub-structures are not resolved by the scatterometry apparatus.

9. The metrology apparatus of claim 8, wherein the gratings comprise double patterned gratings.

10. The metrology apparatus of claim 8, wherein the parameter of the lithographic process comprises overlay.

11. The metrology apparatus of claim 8, wherein the determining the parameter of the lithographic process is further based on a measurement of asymmetry.

12. The metrology apparatus of claim 8, wherein the correcting for the at-resolution offsets is further based on a measurement of asymmetry.

13. The metrology apparatus of claim 8, wherein the grating populations comprise first and second populations of structures in the gratings that are formed in different steps of the lithographic process.

14. The metrology apparatus of claim 8, wherein the offsets between the grating populations comprise positional offsets between interleaved populations of structures in the gratings.

15. A non-transitory computer program product comprising machine-readable instructions for causing a processor to perform operations comprising:
measuring, using a scatterometry apparatus, a $-1^{st}$ order scatterometry image of gratings on a substrate with offsets between grating populations using a first illumination mode;
measuring, using the scatterometry apparatus, a $+1^{st}$ order scatterometry image of the gratings using a second illumination mode;
determining a region of interest in each of the gratings from the $-1^{st}$ order and $+1^{st}$ order scatterometry images;
calculating a difference image of each of the gratings from the $-1^{st}$ order and $+1^{st}$ order scatterometry images to determine a difference in intensity;
determining a parameter of a lithographic process between the grating populations based on the difference in intensity; and
correcting for at-resolution offsets based on the difference in intensity,
wherein the grating populations comprise an overlay grating and at least one auxiliary target,
wherein the at least one auxiliary target comprises gratings having coarse structures and fine at-resolution sub-structures with programmed offsets between the at-resolution sub-structures and the coarse structures, and
wherein the at-resolution sub-structures are not resolved by the scatterometry apparatus.

16. The non-transitory computer program product of claim 15, wherein the gratings comprise double patterned gratings.

17. The non-transitory computer program product of claim 15, wherein the parameter of the lithographic process comprises overlay.

18. The non-transitory computer program product of claim 15, wherein the determining the parameter of the lithographic process is further based on a measurement of asymmetry.

19. The non-transitory computer program product of claim 15, wherein the correcting for the at-resolution offsets is further based on a measurement of asymmetry.

20. The non-transitory computer program product of claim 15, wherein the grating populations comprise first and second populations of structures in the gratings that are formed in different steps of the lithographic process.

* * * * *